United States Patent
Kamura et al.

(10) Patent No.: US 6,187,159 B1
(45) Date of Patent: *Feb. 13, 2001

(54) MECHANISM FOR SETTING OPTICAL LENS BASE MATERIAL ON HOLDER

(75) Inventors: Hitoshi Kamura; Masaaki Yoshihara; Hajime Kamiya, all of Tokyo (JP)

(73) Assignee: Hoya Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/230,080
(22) PCT Filed: May 18, 1998
(86) PCT No.: PCT/JP98/02179
§ 371 Date: Apr. 1, 1999
§ 102(e) Date: Apr. 1, 1999
(87) PCT Pub. No.: WO98/52083
PCT Pub. Date: Nov. 19, 1998

(30) Foreign Application Priority Data

May 16, 1997 (JP) .................................................. 9-143177

(51) Int. Cl.[7] ............................... G02B 7/02; G02B 1/10; G02B 3/00; B29D 11/00; C23C 14/50
(52) U.S. Cl. ............................... 204/298.15; 204/298.02; 204/298.23; 204/298.28; 204/192.1; 204/192.12; 451/390; 118/728
(58) Field of Search ...................... 204/298.15, 298.02, 204/298.23, 298.28, 192.1, 192.12; 451/390; 359/900, 580; 118/728

(56) References Cited

U.S. PATENT DOCUMENTS

| | | | |
|---|---|---|---|
| 5,124,019 | * | 6/1992 | Kunkel et al. .................. 204/289.15 |
| 5,325,812 | | 7/1994 | Thiebaud et al. ..................... 118/500 |
| 5,660,693 | * | 8/1997 | Abramson et al. ............. 204/298.15 |
| 5,808,721 | * | 9/1998 | Wood et al. ......................... 351/159 |

FOREIGN PATENT DOCUMENTS

| | | | |
|---|---|---|---|
| 58-107484 | * | 6/1983 | (JP) . |
| 3-120556 U | * | 12/1991 | (JP) . |
| 8-12373 | * | 1/1996 | (JP) . |
| 8-158049 | * | 6/1996 | (JP) . |
| 8-333682 | | 12/1996 | (JP) . |

* cited by examiner

Primary Examiner—Alan Diamond
(74) Attorney, Agent, or Firm—Oliff & Berridge, PLC

(57) ABSTRACT

Antireflection films are coated on the both sides of an optical lens by sputtering in a sputtering system. In a vacuum processing chamber (22) for performing the sputtering, a plurality of optical lens base materials are placed transversely on a substrate holder (26). The holder (26) is set rotatably in a vacuum atmosphere. The optical lens base materials are embedded to holes (26a) formed in the holder (26), facing their concave surface up, by using ring-shaped holding tools (52, 152). The height of the ring-shaped holding tool (52) is larger than the height of the edge of the optical lens base material (11) within the limits of 2 mm when the thickness of the lens edge of the optical lens base material is large. Part of the ring-shaped holding tool (152) which is put together with the upper surface of the optical lens base material (111) is tapered when the thickness of the lens edge of the optical lens base material is small.

2 Claims, 4 Drawing Sheets

MECHANISM FOR SETTING OPTICAL LENS BASE MATERIAL ON HOLDER

This application is a 371 of PCT/JP98/02179 filed May 18, 1998.

TECHNICAL FIELD

The present invention relates to a holder setting mechanism of an optical lens base material and more particularly to a holder setting mechanism of an optical lens base material for decreasing a difference in film thicknesses at the center part and the peripheral part on the surface of the optical lens base material such as a spectacles plastic lens in forming the film thereon by means of sputtering.

BACKGROUND OF THE INVENTION

A technology for coating an antireflection film on the surface of an optical lens such as a spectacles plastic lens by utilizing the sputtering has been proposed in recent years. The sputtering which is one of film forming method of the semiconductor technology is anticipated to improve the productivity in forming a thin film on the surface of an optical lens and the performance of the lens. Normally, a plurality of optical lens base materials are set on a circular planar holder (a substrate holder or a lens tray) and the holder is rotated in performing the process for depositing the film on the surface of the optical lens by means of the sputtering.

Conventionally, thickness of a film deposited by utilizing the sputtering has been considered to be well distributed. However, the distribution of thickness of the film must be more accurate and uniform in utilizing the sputtering to deposit the thin film onto the optical lens.

Rigorous uniformity is required as for the thickness of the film in particular in depositing an antireflection film on the surface of the optical lens by utilizing the sputtering. When the thickness of the antireflection film on the surface of the lens is not uniform, interference color varies, thus dropping the wearing feeling and the commercial value of the optical lens.

Further, in case of a spectacles lens for example among the optical lenses, the lens has a meniscus shape, whose one surface is concave and the other surface is convex, and the both surfaces have curvatures, respectively. In depositing the antireflection films on the surfaces of the spectacles lens by using the sputtering, normally the spectacles lens is arranged horizontally on a holder and upper and lower targets are disposed so as to face to the both sides of the spectacles lens, respectively, to perform the sputtering on the both sides at the same time. When the lens edge thickness of the spectacles lens is large at the concave surface in particular in that case, oblique incidence of sputtered particles to the peripheral part of the lens increases and the thickness of the film at the lens peripheral part becomes larger than the thickness thereof at the lens center part because distance where the sputtered particles fly and arrive is different due to the difference in curvature. When the lens edge thickness of the spectacles lens is small and when a member which blocks the lens peripheral part exists, non-uniformity of thickness occurs at the blocked part of the lens peripheral part.

An object of the present invention is to meet the above-mentioned requirements and to solve the above-mentioned problems, and is to provide a mechanism for setting the optical lens base materials on a holder, which allows the thickness of the film to be almost equalized at the center part and the peripheral part of the lens and the distribution of the film thickness to be equalized on the surface in depositing the thin film on the surface of the optical lens base material by means of the sputtering.

DISCLOSURE OF THE INVENTION

In order to achieve the above-mentioned objects, the holder setting mechanism of the optical lens base material according to the present invention is constructed as follows.

A plurality of optical lens base materials are arranged horizontally on a holder in a sputtering system in forming thin films on the both sides of the optical lens base materials. The holder is set rotatably in a vacuum atmosphere within the sputtering system. Each of the optical lens base materials is embedded to each of holes formed in the holder while facing its concave surface up by using a ring-shaped holding tool. The ring-shaped holding tool is formed such that its height is larger than the height of the edge of the optical lens base material within the limits of 2 mm when the thickness of the lens edge of the optical lens base material is large. Such shape of the ring-shaped holding tool blocks the oblique incidence of sputtered particles to the lens peripheral parts on the concave surface which is the upper surface of the optical lens base material and allows the distribution of thickness to be uniform by nearly equalizing the thickness of the film at the center part with that at the peripheral part of the lens.

When the thickness of the lens edge of an optical lens base material is small, part of a ring-shaped holding tool which is put together with the upper surface of the optical lens base material is tapered. Such shape of the ring-shaped holding tool decreases blocked part on the concave surface which is the upper surface of the optical lens base material, decreases the non-uniformity of the thickness and makes the distribution of the thickness uniform.

BEST MODES FOR CARRYING OUT THE INVENTION

Preferred embodiments of the present invention will be explained below based on the appended drawings.

Figure 1:
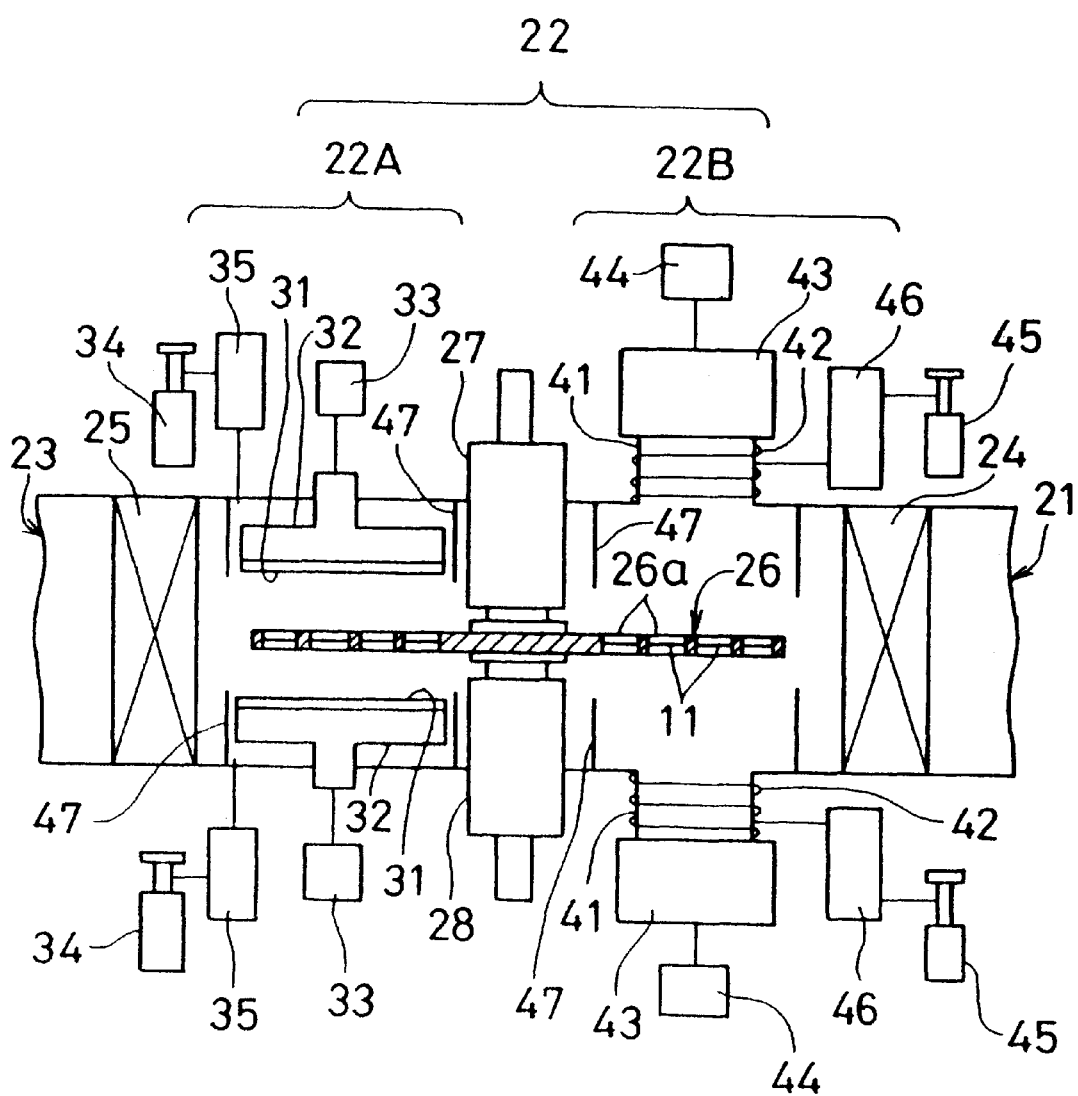
FIG. 1 is a structural diagram of the main part of a sputtering film deposition system to which the present invention is applied.

FIG. 1 shows one example of a sputtering system to which the present invention is applied. The structure and a film deposition process of the system (hereinafter referred as the sputtering film deposition system) for depositing antireflection films on the both sides of a plastic base material by utilizing sputtering will be explained with reference to FIG. 1. FIG. 1 is a longitudinal section view showing the main part of the internal structure of the sputtering film deposition system. This sputtering film deposition system allows the antireflection films having a multi-layered film structure for example to be formed simultaneously on the both sides of the plastic base materials 11. It is noted that the material of the base material 11 is not limited to plastic and may be glass for example.

The plastic base material 11 is the base material of the spectacles plastic lens and one example of plastic optical parts. The antireflection films must be coated on the both sides of the plastic base material 11 as the spectacle plastic lens. This antireflection film is a multi-layered film in which high-refractive films (e.g., $ZrO_2$) and low-refractive films (e.g., $SiO_2$) for example are laminated alternately.

Because the above-mentioned plastic base material 11 is a spectacles plastic lens having the meniscus shape, it has curvatures on the both sides thereof. In the concrete, one of the both surfaces of the plastic base material 11 is concave and the other surface is convex. Such plastic base materials 11 are set transversely and concentrically in rows (or lines) of three on a substrate holder (while it is a lens tray for placing a plurality of plastic base materials, it will be called as a "substrate holder" here following to its common name) 26 which is a disk which rotates centering on its center part, which is transversely placed and which has a plurality of through holes for having ring-shaped holding tools inside. Under this circumstance, the plastic base materials 11 are placed such that the concave surface faces up and the convex surface faces down.

The sputtering film deposition system comprises, roughly, an introduction chamber 21 for carrying in an object to be processed, a vacuum processing chamber (sputtering film deposition chamber) 22 for depositing the high-refractive films and the low-refractive films alternately on the both sides of the plastic base materials 11, and a preliminary processing chamber 23. The introduction chamber 21, the vacuum processing chamber 22 and the preliminary processing chamber 23 are partitioned by gate valves 24 and 25, respectively. The gate valves 24 and 25 are opened/closed at appropriate timing in carrying in/out the object.

The substrate holder 26 carried into the sputtering film deposition system via the introduction chamber 21 is set within the vacuum processing chamber 22 via the gate valve 24. A carry-in/carry-out mechanism for transferring the substrate holder 26 is not shown in FIG. 1. The substrate holder 26 has the shape of disk as described before. A large number of base material holding holes (the plurality of through holes) 26a are formed in the substrate holder 26. The above-mentioned plastic base materials 11 are placed on each of those holes 26a. Because the base material holding hole 26a is opened to the upper and lower sides, the respective surfaces of the both surfaces of the plastic base material 11 held by the base material holding hole 26a face to the upper and lower spaces of the substrate holder 26. As a result, the above-mentioned antireflection films may be formed on the both sides of the plastic base material 11 by means of sputtering.

The sputtering film deposition process in the vacuum processing chamber 22 comprises, more specifically, a sputtering step for forming a metal thin film and a transforming step for transforming the metal thin film deposited in the sputtering step into an oxide thin film. Therefore, the vacuum processing chamber 22 comprises a sputtering step area 22A and a transforming step area 22B in the aspect of the structure of the system.

The substrate holder 26 is supported by an upper supporting member 27 and a lower supporting member 28 at its center part and is placed in the horizontal state (transverse state) in the vacuum processing chamber 22. The upper supporting member 27 and the lower supporting member 28 are driven up and down by a hydraulic cylinder and others not shown and are rotatable by a built-in motor rotation mechanism. The substrate holder 26 is kept rotating at a certain rotating speed by the rotating operation of the upper and lower supporting members 27 and 28 in forming the antireflection films on the plastic base material 11. Accordingly, while passing through the sputtering step area 22A and transforming step area 22B, the large number of plastic base materials 11 arranged on the substrate holder 26 undergo the sputtering process in the sputtering step area 22A and the transforming process in the transforming step area 22B.

Sputtering units are disposed above and below the substrate holder 26 in the sputtering step area 22A. Each sputtering unit comprises a target 31, a sputtering electrode 32, a sputtering power supply 33, a sputtering gas cylinder 34 and a mass-flow (controller) 35. When the substrate holder 26 rotates and the plastic base materials 11 come between the upper and lower targets 31, target substances emitted from the targets 31 in the sputtered state deposit on the both sides of the plastic base materials 11 and thin films of the target substance are formed on the both sides of the plastic base materials 11. Sputtering gas such as an argon gas is introduced from the sputtering gas cylinder 34 via the mass-flow 35 at this time to regulate the sputtering atmosphere.

In order to fabricate the above-mentioned antireflection films, according to the sputtering step described above and the transforming step described later the high-refractive film of metal oxide $ZrO_2$ is formed as a first layer, the low-refractive film of metal oxide $SiO_2$ is formed as a second layer in the sputtering step in the vacuum processing chamber 22. Thereafter, the high-refractive films $ZrO_2$ and the low-refractive films $SiO_2$ are formed alternately up to a tenth layer for example. The metals which are the base of the respective metal oxides are deposited in the sputtering step area 22A. A target composed of zirconium Zr is prepared as the target 31 to deposit Zr on the both sides of the plastic base material 11 in the first sputtering step for forming the high-refractive film of the first layer. Next, the sputtering is implemented by replacing the target to the other one composed of silicon Si in the sputtering step for forming the low-refractive film of the second layer to deposit Si on the both sides of the plastic base material 11. The antireflection film may be fabricated by laminating the high-refractive films and the low-refractive films alternately by replacing the target with the substance for the high-refractive film or the substance for the low-refractive film alternately as described above. It is noted that a mechanism for replacing the target is not shown in FIG. 1.

Inductive coupled plasma generating units are disposed above and below the substrate holder 26 in the transforming step area 22B. The inductive coupled plasma generating unit comprises a high-frequency discharging chamber 41, a high-frequency coil 42, a matching box 43, a high-frequency power supply 44, a reactive gas cylinder 45 and a mass-flow controller 46. When the substrate holder 26 rotates and the plastic base materials 11 to be processed come between the upper and lower inductive coupled plasma generating units, the plastic base materials 11 are exposed to plasma of oxygen introduced from the reactive gas cylinder 45 via the mass-flow 46. Thus, the metal (Zr or Si) deposited in the sputtering step is oxidized and is transformed into oxide ($ZrO_2$ or $SiO_2$).

The antireflection films 13 having the multi-layered structure composed of the $ZrO_2$ (the high-refractive films) and $SiO_2$ (the low-refractive films) shown in FIG. 1 may be formed on the both sides of the plastic base material 11 by repeating the sputtering step and the transforming step on the both sides of the large number of plastic base materials 11 on the substrate holder 26 rotatably placed within the vacuum processing chamber 22 while replacing the targets.

It is noted that a shielding member 47 is provided within the vacuum processing chamber 22 in order to separate the sputtering step area 22A from the transforming step area 22B.

Figure 2:
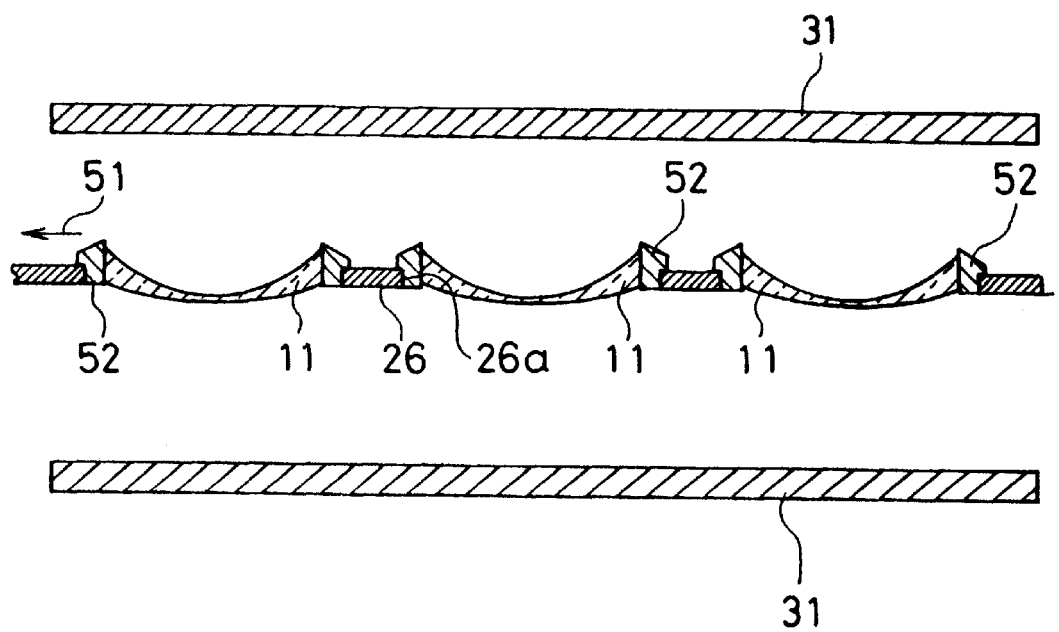
FIG. 2 is an enlarged partial longitudinal section view showing the state of deposition of plastic base materials on a substrate holder.

Next, a mechanism for holding the plastic base materials 11 on the substrate holder 26 will be explained with reference to FIGS. 2–4. FIG. 2 is an enlarged diagram concretely showing the state of the plastic base materials 11 disposed on the substrate holder 26. In FIG. 2, an arrow 51 indicates the direction of the center of rotation of the substrate holder 26. The plastic base materials 11 are placed on base material holding holes 26a formed in the substrate holder 26 by using base material holding tools 52. As it is apparent from FIG. 2, each of the plurality of plastic base materials 11 is placed such that the concave surface faces up and the convex surface faces down and so as to be removable by utilizing the base material holding tool 52.

Figure 3:
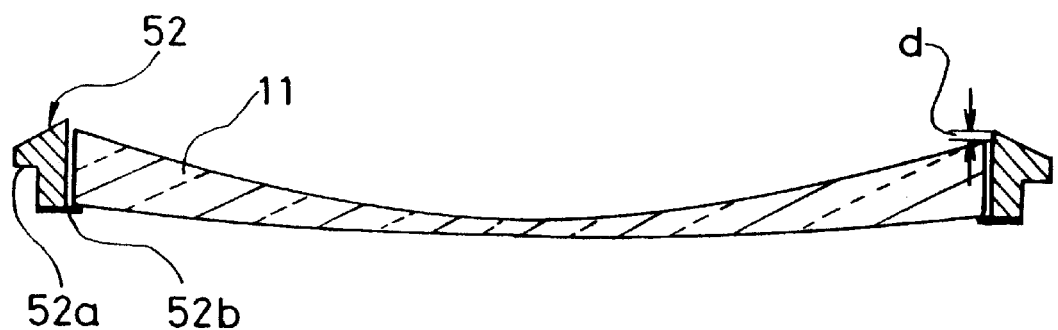
FIG. 3 is a longitudinal section view showing a first example of a base material holding tool.

FIG. 3 is an enlarged view of the base material holding tool 52 and the plastic base material 11. This plastic base material 11 is a spectacles lens whose concave surface is facing up and whose convex surface is facing down, which is made from diethylene glycol bisaryl carbonate resin whose refractive index (nd) is 1.499, which is spherically designed and whose outer diameter is 76 mm. Its power is −4.00 diopter and its lens edge thickness is relatively thick. The lens edge thickness is about 7.9 mm for example. The base material holding tool 52 used for the plastic base material 11 having such configuration of a concave and deeply curved minus lens (preferably a minus high-power lens of −4.00 diopter or more) is can be fitted to or removed from the substrate holder 26 and has a ring shape as a whole. It is provided with a hooking section 52a which is hooked by the base material holding hole 26a at the upper and outer peripheral portion thereof and a supporting section 52b for supporting the plastic base material 11 at the lower and inner peripheral portion thereof as shown in FIG. 2. The configuration of the base material holding tool 52 is characterized in that the height of the base material holding tool 52 is larger than the lens edge thickness, i.e., the height of the peripheral portion, of the plastic base material 11, by d. This d is preferable to be a length which is substantially limited to be 2 mm. That is, when it is too high, a blocked part is created in contrary, bringing about a disadvantageous effect. It is possible to block oblique incidence of sputtered particles to the peripheral part of the lens on the concave surface of the plastic base material 11 by heightening the base material holding tool 52 more than the lens peripheral portion of the plastic base material 11 by d. It then allows the difference in thickness of the film at the center part and the peripheral part of the lens on the concave surface of the plastic base material 11 to be decreased and the distribution of the film thickness on the concave surface to be equalized.

Figure 4:
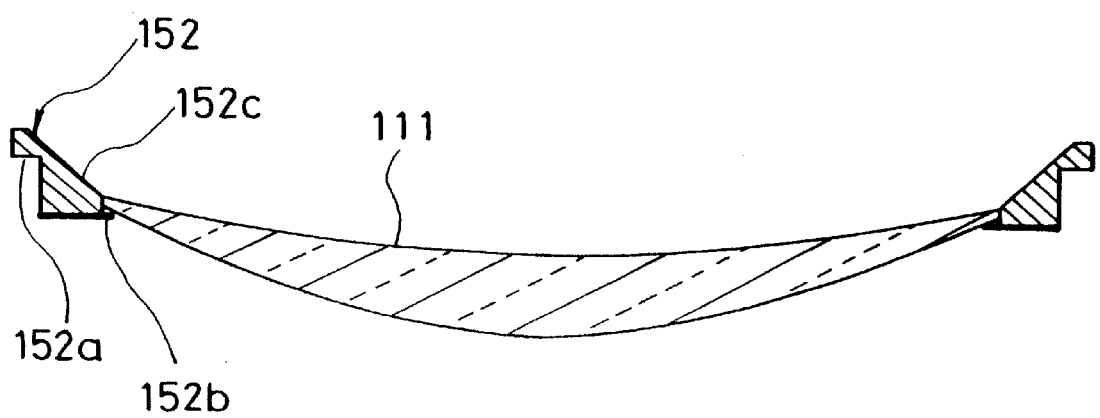
FIG. 4 is a longitudinal section view showing a second example of the base material holding tool.
Figure 5:
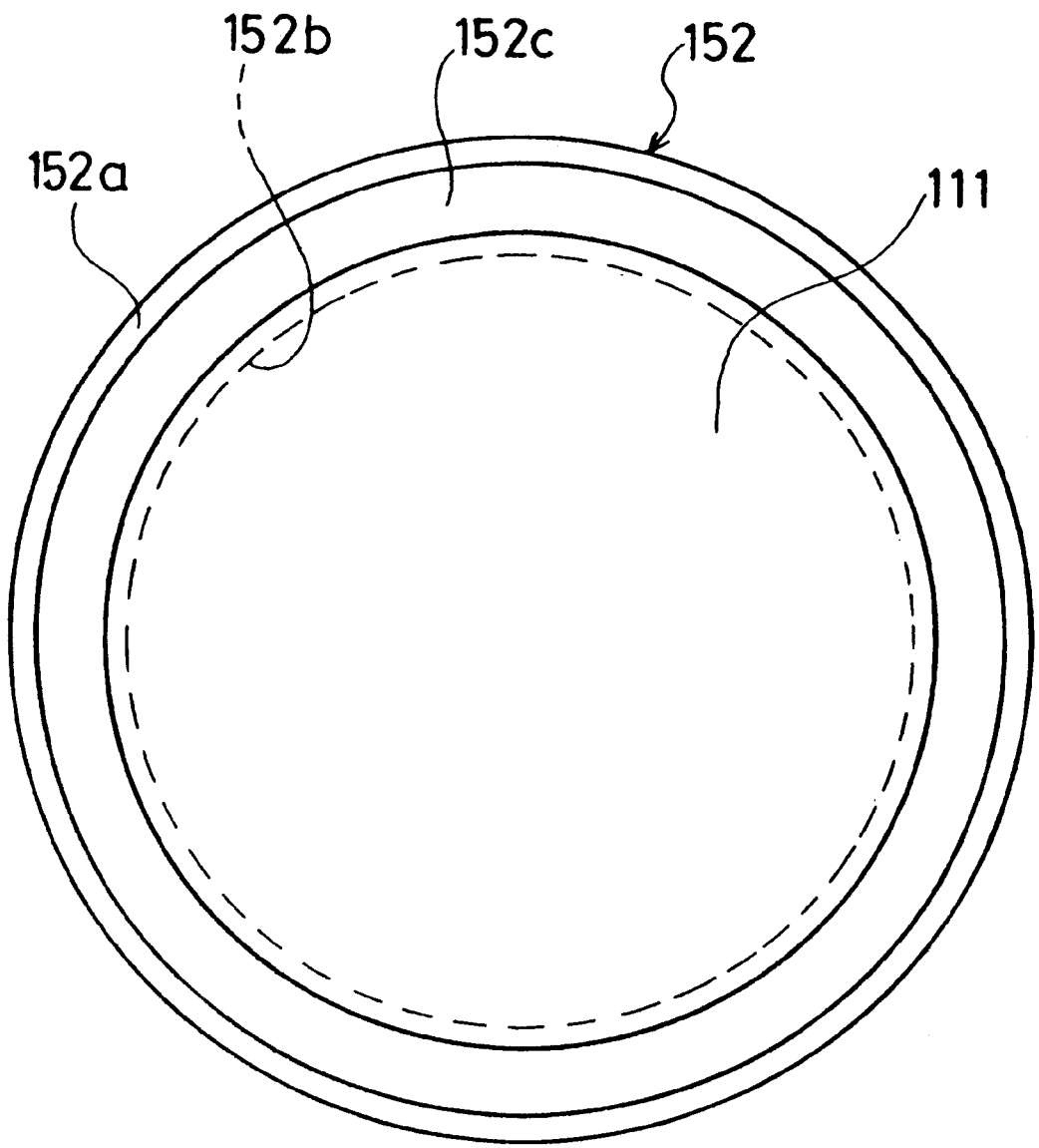
FIG. 5 is a plan view of the second example of the base material holding tool.

FIGS. 4 and 5 show a base material holding tool suitably used for a plastic base material (the same material with that shown in FIG. 3) having another configuration (preferably a minus low-power lens or a plus lens of −2.00 diopter or less). The configuration of the plastic base material 111 is characterized in that its power is +2.00 diopter and that its lens edge thickness is 1.0 mm, i.e., is relatively small. For the plastic base material 111 whose curve of the concave surface is shallow, a tapered surface 152c is formed at part of a base material holding tool 152 which is put together with the concave surface, i.e., the upper surface, of the lens. It is noted that base material holding tool 152 has a hooking section 152a and a supporting section 152b similarly to the base material holding tool 52. When the base material holding tool 152 having such configuration is used, the tapered surface 152c of the base material holding tool 152 and the concave surface of the plastic base material 111 are put together smoothly as if they are one plane and no part which is blocked on the concave surface of the plastic base material 111 is brought about. Accordingly, it is possible to prevent non-uniformity of thickness from occurring during the sputtering.

The thickness may be controlled more accurately by preparing not only one kind of base material holding tool 152 but also a plurality of kinds of base material holding tools whose angles of the tapered surface differ (e.g., three kinds of holders for a minus low-power lens (−2.00 diopter or less), a plus low-power lens (+2.00 diopter or less) and a plus powerful lens of more than that) and by grouping and using them depending on the diopter of the lenses.

Industrial Applicability

Because the base material holding tool having the predetermined height is used for the optical lens base material whose edge thickness is large in setting the optical lens base material in the hole formed in the substrate holder in the sputtering step for depositing the antireflection films or the like on the both sides of the optical lens base material, the present invention can prevent the oblique incidence of sputtered particles and is suited for equalizing the distribution of the thickness of the film on the concave surface. Because the base material holding tool having the tapered surface is used for the optical lens base material whose edge thickness is small, the present invention can eliminate blocked part on the concave surface, can decrease the non-uniformity of thickness of the film and is suited for equalizing the distribution of the thickness of the film on the concave surface.

What is claimed is:

1. A holder setting mechanism for a sputtering film deposition system, wherein a plurality of spectacle lenses, each of which is a minus high-power lens with an upper surface being concave and a lower surface being convex, are respectively placed on a substrate holder through ring-shaped holding tools in a transverse state, and said substrate holder is set to be rotatable in a vacuum atmosphere, and thin films are deposited on the upper and lower surfaces of each spectacle lens of said spectacle lenses at the same time, the improvement comprising a structure that:

said substrate holder has holes for supporting said ring-shaped holding tools;

each ring-shaped holding tool of said ring-shaped holding tools has a hooking section at an upper and outer peripheral portion, which is hooked on said hole, and is freely fitted to or removed from said substrate holder, and further has a supporting section for supporting each of said plurality of spectacle lenses at a lower and inner peripheral portion;

each spectacle lens of said plurality of spectacle lenses is held by said ring-shaped holding tool in a state of directing the concave surface to the upper side and the convex surface to the lower side, and wherein said ring-shaped holding tool has a height and each of said plurality of spectacle lenses has an edge having an edge height, said height of said ring-shaped holding tool is larger than said edge height of said plurality of spectacle lenses within the limits of 2 mm, whereby oblique incidence of sputtered particles to a peripheral part in the concave surface of said spectacle lenses is blocked.

2. A holder setting mechanism for a sputtering film deposition system, wherein a plurality of spectacle lenses, each of which is a plus lens with an upper surface being concave and a lower surface being convex, are respectively placed on a substrate holder through ring-shaped holding tools in a transverse state, and said substrate holder is set to be rotatable in a vacuum atmosphere, and thin films are deposited on the upper and lower surfaces of each of said plurality of spectacle lenses at the same time, the improvement comprising a structure that:

- said substrate holder has holes for supporting said ring-shaped holding tools respectively;
- each ring-shaped holding tool has a hooking section at an upper and outer peripheral portion, which is hooked on said hole, and is freely fitted to or removed from said substrate holder, and further has a supporting section for supporting each of said plurality of spectacle lenses at a lower and inner peripheral portion;
- each of said plurality of spectacle lenses is held by said ring-shaped holding tool in a state of directing the concave surface to an upper side and the convex surface to the lower side, and
- an inner peripheral part of said ring-shaped holding tool is tapered, whereby said ring-shaped holding tool is able to carry out oblique incidence of sputtered particles to a peripheral part in the concave surface of each of said plurality of spectacle lens.

\* \* \* \* \*